(12) United States Patent
Lin et al.

(10) Patent No.: US 7,781,885 B2
(45) Date of Patent: Aug. 24, 2010

(54) OPTOELECTRONIC SEMICONDUCTOR PACKAGE AND METHOD FOR ATTACHING HEAT DISSIPATION ELEMENT THERETO

(75) Inventors: Tai-Wei Lin, Hsinchu (TW); Chi-Chui Yun, Hsinchu (TW); Jia-Bin Huang, Hsinchu (TW); Zeu-Chia Tan, Hsinchu (TW); Wan-chen Lai, Hsinchu (TW)

(73) Assignee: Young Optics Inc., Hsin-Chu (TW)

( * ) Notice: Subject to any disclaimer, the term of this patent is extended or adjusted under 35 U.S.C. 154(b) by 96 days.

(21) Appl. No.: 12/114,623

(22) Filed: May 2, 2008

(65) Prior Publication Data
US 2009/0052483 A1 Feb. 26, 2009

(30) Foreign Application Priority Data
Aug. 20, 2007 (TW) .............................. 96130653 A

(51) Int. Cl.
*H01L 23/10* (2006.01)
*H01L 21/00* (2006.01)
(52) U.S. Cl. .................. 257/720; 257/706; 257/707; 438/122
(58) Field of Classification Search ................ 257/706, 257/707, 720; 438/122
See application file for complete search history.

(56) References Cited

U.S. PATENT DOCUMENTS

| 4,830,678 | A | * | 5/1989 | Todorof et al. ............. 136/259 |
| 5,105,259 | A | * | 4/1992 | McShane et al. ............ 257/667 |
| 5,898,575 | A | * | 4/1999 | Hawthorne et al. ......... 361/809 |
| 6,011,304 | A | * | 1/2000 | Mertol ....................... 257/706 |
| 6,939,742 | B2 | * | 9/2005 | Bhatia et al. ................ 438/117 |
| 7,126,217 | B2 | * | 10/2006 | Chiu et al. .................. 257/704 |
| 7,321,161 | B2 | * | 1/2008 | Teixeira et al. .............. 257/675 |
| 2004/0041222 | A1 | * | 3/2004 | Loh ........................... 257/433 |
| 2005/0012202 | A1 | * | 1/2005 | Bock et al. .................. 257/706 |
| 2006/0292747 | A1 | * | 12/2006 | Loh ........................... 438/116 |

FOREIGN PATENT DOCUMENTS

TW 200723623 12/1994

* cited by examiner

*Primary Examiner*—Matthew C Landau
*Assistant Examiner*—James M Mitchell
(74) *Attorney, Agent, or Firm*—Muncy, Geissler, Olds & Lowe, PLLC

(57) ABSTRACT

An optoelectronic semiconductor package for packaging a heat source capable of emitting light includes a base, a seal member, and a plurality of heat-dissipation elements. The base carries and touches the heat source and has a plurality of openings formed thereon, and the seal member is used to seal the heat source on the base. Each of the heat-dissipation elements is inserted in one of the corresponding openings, and the heat-dissipation element placed in the corresponding opening is deformed to result in a tight coupling between the heat-dissipation element and the base.

9 Claims, 14 Drawing Sheets

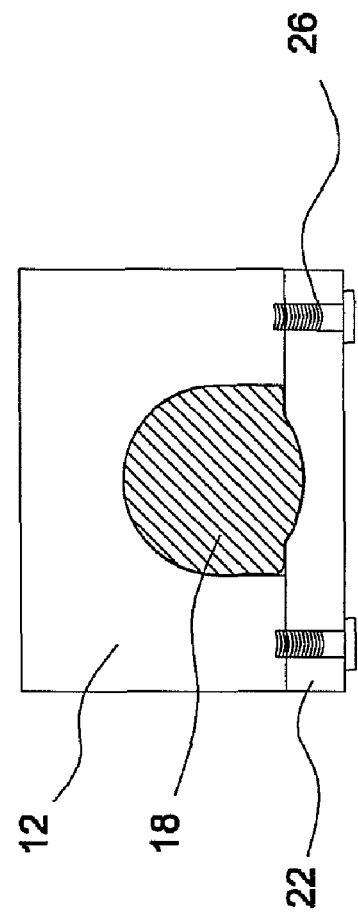
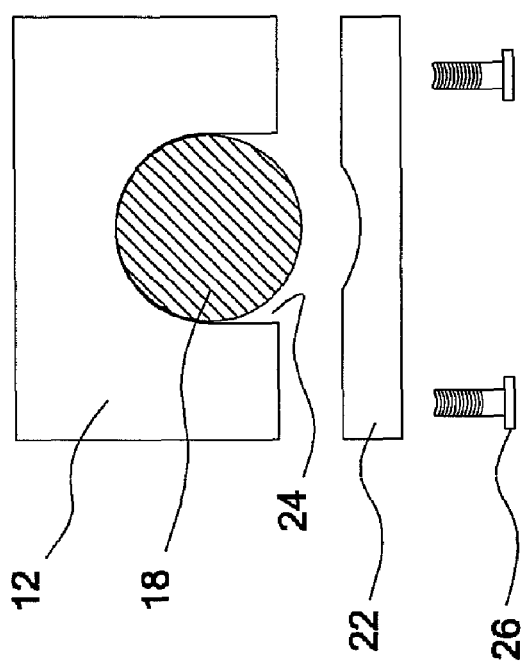
FIG. 3A
FIG. 3B

| Input power (W) | | 20 | 30 | 40 | 50 |
|---|---|---|---|---|---|
| Backside temperature of the chip (°C) | Conventional design | 38.2 | 45.6 | 54.6 | 64 |
| | Embodiment (FIG. 2) | 38.3 | 42.8 | 47.1 | 51.1 |
| | Improvement (%) | -0.26 | 6.14 | 13.74 | 20.16 |
| Thermal resistance at backside of the chip (°C/W) | Conventional design | 0.69 | 0.7 | 0.74 | 0.78 |
| | Embodiment (FIG. 2) | 0.67 | 0.59 | 0.55 | 0.52 |
| | Improvement (%) | 2.90 | 15.71 | 25.68 | 33.33 |

FIG. 4

OPTOELECTRONIC SEMICONDUCTOR PACKAGE AND METHOD FOR ATTACHING HEAT DISSIPATION ELEMENT THERETO

CROSS REFERENCE TO RELATED APPLICATION

This application claims priority of application No. 096130653 filed in Taiwan R.O.C on Aug. 20, 2007 under 35 U.S.C. §119; the entire contents of which are hereby incorporated by reference.

BACKGROUND OF THE INVENTION

1. Field of the Invention

The invention relates to an optoelectronic semiconductor package, particularly to an optoelectronic semiconductor package having heat-dissipation elements.

2. Description of the Related Art

FIG. 1 shows a schematic cross-sectional diagram illustrating a conventional laser diode device 100. As shown in FIG. 1, the laser diode device 100 includes a die package 102 and a heat sink 104. The die package 102 includes a laser diode chip 106, a base 108, and a cover 110. The laser diode chip 106 is mounted on the base 108, and the cover 110 covers the laser diode chip 106 to seal it on the base 108. The heat sink 104, serving to dissipate the heat generated by the laser diode chip 106 during its operation, includes a copper block 112 and multiple heat pipes 114. The heat pipes 114 penetrate into the copper block 112 and are soldered to the copper block 112; for example, the heat pipes 114 may stick to the copper block 112 by soldering tin baked for hours in a tin furnace at 260° C.

However, according to the conventional design, there are a first interface between the laser diode chip 106 and the base 108, a second interface between the base 108 and the copper block 112, and a third interface between the copper block 112 and the heat pipe 114 in the heat flow path from the laser diode chip 106 to the heat sink 104, thus resulting in considerable thermal contact resistance. Further, the distance between the heat pipe 114 and the laser diode chip 106, about 8 mm, is too long to maintain efficient heat-dissipation. Besides, soldering the heat pipes 114 and the copper block 112 together takes more time and requires higher fabrication and equipment costs.

BRIEF SUMMARY OF THE INVENTION

The invention provides an optoelectronic semiconductor package having excellent heat-dissipation efficiency and a method for attaching a heat-dissipation element to the optoelectronic semiconductor package.

According to an embodiment of the invention, an optoelectronic semiconductor package for packaging a heat source capable of emitting light includes a base, a seal member, and a plurality of heat-dissipation elements. The base carries and touches the heat source and has a plurality of openings formed thereon. The seal member is used to seal the heat source on the base. Each of the heat-dissipation elements is inserted in one of the corresponding openings, and the heat-dissipation element placed in the corresponding opening is deformed to result in a tight coupling between the heat-dissipation element and the base.

In one embodiment, the base includes a first side surface in contact with the heat source and a second side surface opposite the first side surface, and the openings are provided on the second side surface. The heat-dissipation element placed in the corresponding opening is pressed by a pressing plate to generate deformation and thus creates an interference fit between the opening of the base and the heat-dissipation element.

In an alternate embodiment, the openings penetrate the inside of the base but are not in contact with the first side surface and the second side surface. Each of the openings includes a main hole for receiving the heat-dissipation element and an auxiliary hole next to and in connection with the main hole. The pin inserted in the auxiliary hole presses against and deforms the heat-dissipation element placed in the main hole to create an interference fit between the heat-dissipation element and the main hole of the base.

In an alternate embodiment, the pin inserted in the auxiliary hole moves freely and can be forced to press against the heat-dissipation element placed in the main hole by exerting external force thereon. Thus, the heat-dissipation element is deformed to create an interference fit with the main hole of the base.

According to the above embodiments, heat-dissipation elements are not soldered to a base as in the conventional method but are pressed and deformed to allow for a coupling between themselves and a base. Therefore, the coupling of heat-dissipation elements and the base is greatly simplified and the fabrication cost is also lowered. Further, since the heat-dissipation elements are directly attached to the base, the distance between the heat-dissipation elements and a heat source capable of emitting light can be shortened. In that case, the heat flow path is shortened and the operation temperature of the heat-dissipation elements is allowed to maintain at a preferred range to improve the working efficiency of heat-dissipation elements. Besides, since the copper block is no longer needed, the fabrication cost is further lowered and the number of interfaces that block heat flow is decreased to effectively reduce contact thermal resistance.

Another embodiment of the invention is related to a method for attaching heat-dissipation elements to an optoelectronic semiconductor package. First, a plurality of openings are provided on a base that carries and touches a heat source. Next, a plurality of heat-dissipation elements are placed in the openings, with each heat-dissipation element being corresponding to one opening. Finally, at least one rigid member is used to press against and deform heat-dissipation element to create an interference fit between the heat-dissipation element and its corresponding opening receiving the heat-dissipation element.

In one embodiment of the invention, after the rigid member presses against and deforms each heat-dissipation element, it is fixed to the base. The rigid member may be attached to the base by screwing, riveting, engagement, or insertion.

In an alternate embodiment, after the rigid member presses against and deforms each heat-dissipation element, it is removed from the base.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

FIGS. 3A and 3B show schematic diagrams illustrating the design principle of the embodiment in FIG. 2.

FIG. 4 lists the actual measured values of the temperatures and thermal resistances of the embodiment shown in FIG. 2.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," and variations thereof herein are used broadly and encompass direct and indirect connections, couplings, and mountings. Similarly, "adjacent to" and variations thereof herein are used broadly and encompass directly and indirectly "adjacent to". Therefore, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 2:
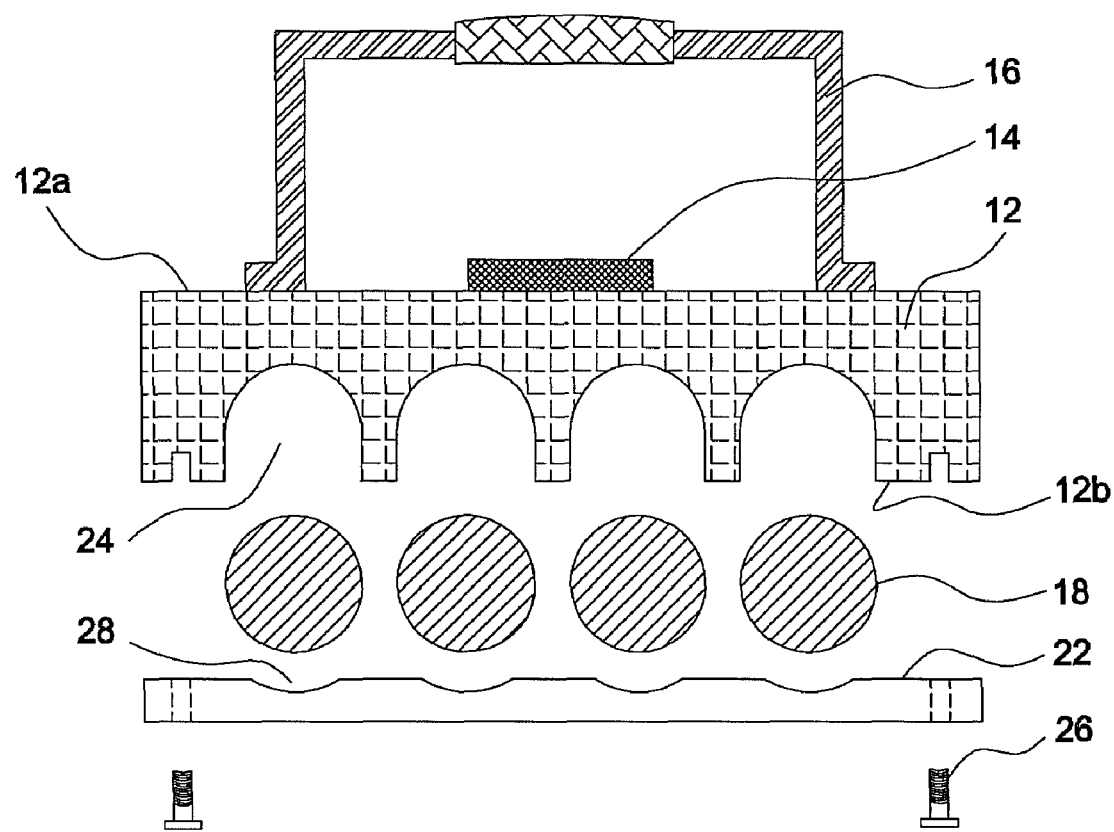
FIG. 2 shows a cross-sectional schematic diagram illustrating a laser diode package according to an embodiment of the invention.

FIG. 2 shows a cross-sectional schematic diagram illustrating a laser diode package according to an embodiment of the invention. Referring to FIG. 2, the laser diode package 10 used to encapsulate a laser diode chip 14 includes a base 12, a cover 16, a plurality of heat pipes 18, and a pressing plate 22.

The base 12 carries the laser diode chip 14 and assists in dissipating the heat generated by the laser diode chip 14. In one embodiment, the top surface 12a of the base 12 is in contact with the laser diode chip 14. The cover 16 covers the laser diode chip 14 to seal it on the base 12.

According to this embodiment, the base 12 may be made of high thermal conductivity material like oxygen-free copper. In the bottom of the base 12, a plurality of separate openings 24 are provided opposite the laser diode chip 14, with each opening 24 being corresponding to a heat pipe 18. Each opening 24 made on the bottom surface 12b may stretch toward the inside of the base 12; in one embodiment, each opening 24 which extends in one direction on the base 12 is formed as a slot. The diameter of the opening 24 is slightly larger than the diameter of the heat pipe 18 to allow the heat pipe 18 to be inserted in one of the corresponding openings 24. The pressing plate touches the bottom surface 12a of the base 12 and is set to the base 12 by screws 26. In one embodiment, a plurality of cavities which are shaped to fit the outlines of the heat pipes 18 are formed on the pressing plate 22 to facilitate smooth engagement.

Figure 1:
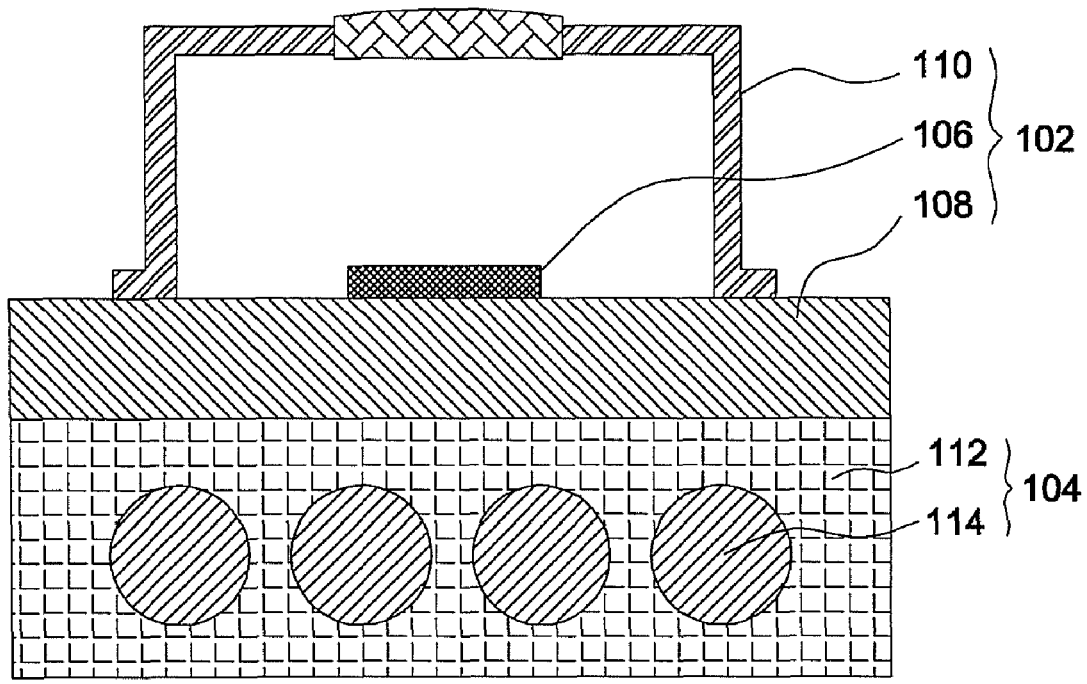
FIG. 1 shows a schematic cross-sectional diagram illustrating a conventional laser diode device.

Referring to both FIGS. 3A and 3B, after a heat pipe 18 is inserted in the one of the corresponding openings 24 (FIG. 3A), there is still a clearance between the heat pipe 18 and the opening 24. Next, when the pressing plate 22 is screwed to the base 12 (FIG. 3B), the pressing plate 22 is forced to press against and meanwhile deform the heat pipe 18 to result in a tight coupling between the heat pipe 18 and the base 12. In other words, the heat pipe 18 which undergoes elastic deformation generated by the press of the pressing plate 22 provides an interference fit with the opening 24 of the base 12. Therefore, the clearance between the side wall of the heat pipe 18 and the base 12 is largely eliminated to considerably increase their contact areas and improve heat-dissipation efficiency as a result. Besides, compared to the conventional design shown in FIG. 1, the heat pipe 18 is deformed to tightly fit into the opening 24 of the base 12 according to the embodiment, without using a soldering process like tin soldering. Thus, the coupling of the heat pipe 18 and the base 12 is greatly simplified and the fabrication cost is also lowered. Further, in this embodiment, the heat pipe 18 is directly attached to the base 12, a constituent part of the laser diode package 10, rather than attached to the copper block 112 of the heat sink 104 that is to be connected to the base 108, as shown in FIG. 1. Thus, the distance between the heat pipe 18 and a heat source capable of emitting light (like the laser diode chip 14) can be shortened to about 2 mm. In that case, the heat flow path is shortened and the operation temperature of the heat pipe 18 is allowed to maintain at a preferred range, about 50° C. to 70° C., to improve the working efficiency of the heat pipe 18. Besides, since the copper block, the heat-dissipation element used in the conventional design, is no longer needed in this embodiment, the fabrication cost is further lowered and the number of interfaces that block heat flow is decreased to effectively reduce contact thermal resistance.

FIG. 4 lists actual measured values according to the above embodiment. From FIG. 4, it can be clearly seen that the temperature and thermal resistance of the backside point of the laser diode chip 14 according to the embodiment shown in FIG. 2 are lower than those in the conventional design. Especially, the measured values are decreased to a greater extent when the input power is more than 30 Watts.

Figure 5:
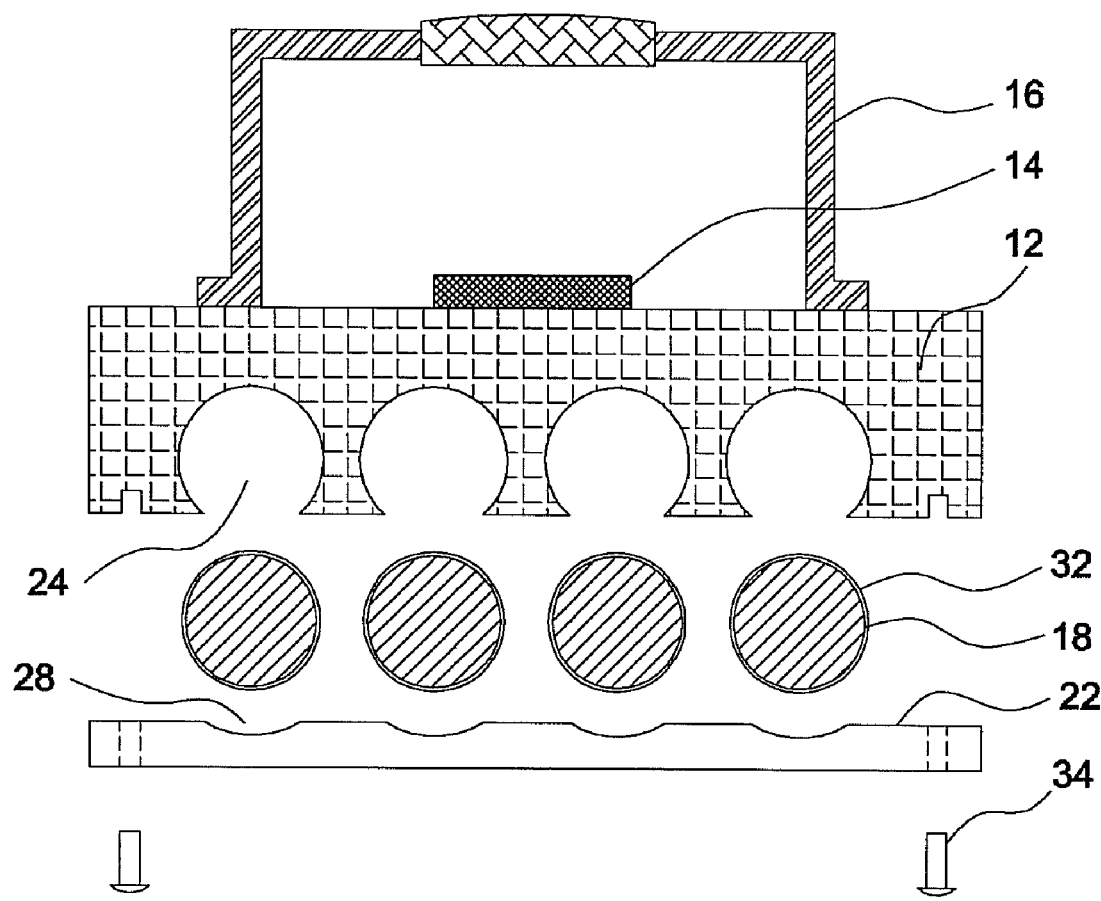
FIG. 5 shows a cross-sectional schematic diagram according to another embodiment of the invention.

As shown in FIG. 5. in one embodiment, the side wall of the heat pipe 18 of the laser diode package 30 is coated with a layer of thermally conductive paste 32 like thermal grease or thermal glue so as to further reduce contact thermal resistance and increase the heat-dissipation efficiency as a result. In addition, the pressing plate 22 may be attached to the base 12 by riveting with rivets 34 to press against and deform the heat pipes 18. Moreover, the shape of each opening 24 formed on the bottom of the base 12 and the shape of a corresponding cavity 28 formed on the pressing plate 22 are complementary to each other. For example, as shown in FIG. 5, the opening 24 and the cavity 28 are unified to be in the shape of a complete circle that corresponds to the circular cross-section of the heat pipe 18.

Figure 6:
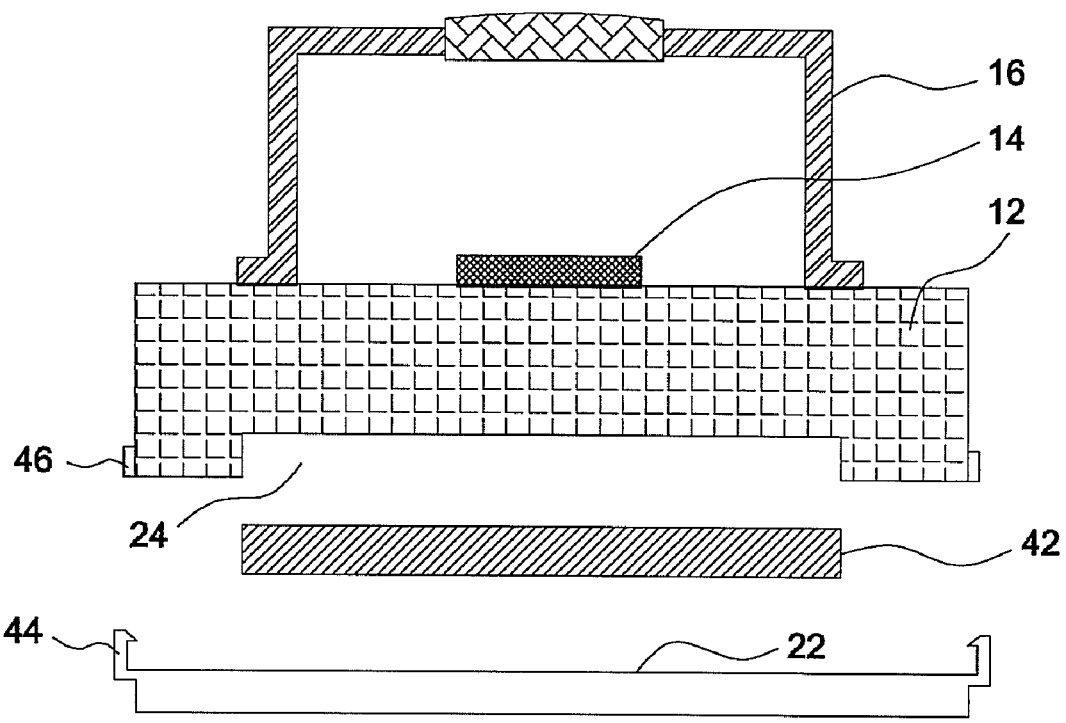
FIG. 6 shows a cross-sectional schematic diagram according to another embodiment of the invention.

As shown in FIG. 6, in one embodiment, the base 12 of the laser diode package 40 is provided with a opening 24 having a rectangular cross-section in which a heat spreader 42 can be placed. Further, the pressing plate 22 and the edge of the base 12 form a catch 44 and a wedge structure 46, respectively. As the pressing plate 22 engages with the bottom of the base 12 with the catch 44 and the wedge structure 46 fit together, the pressing plate 22 presses against and deforms the heat spreader 42 to have the heat spreader 42 tightly fit in the opening 24.

Therefore, from the above embodiments, it can be found different types of heat-dissipation elements can be used in the invention simply by adjusting the shape and size of the opening 24 formed in the base 12. Besides, the way of attaching the pressing plate 22 on the base 12 is not limited, as long as the pressing plate 22 is allowed to press and deform the heat-dissipation element.

Figure 7:
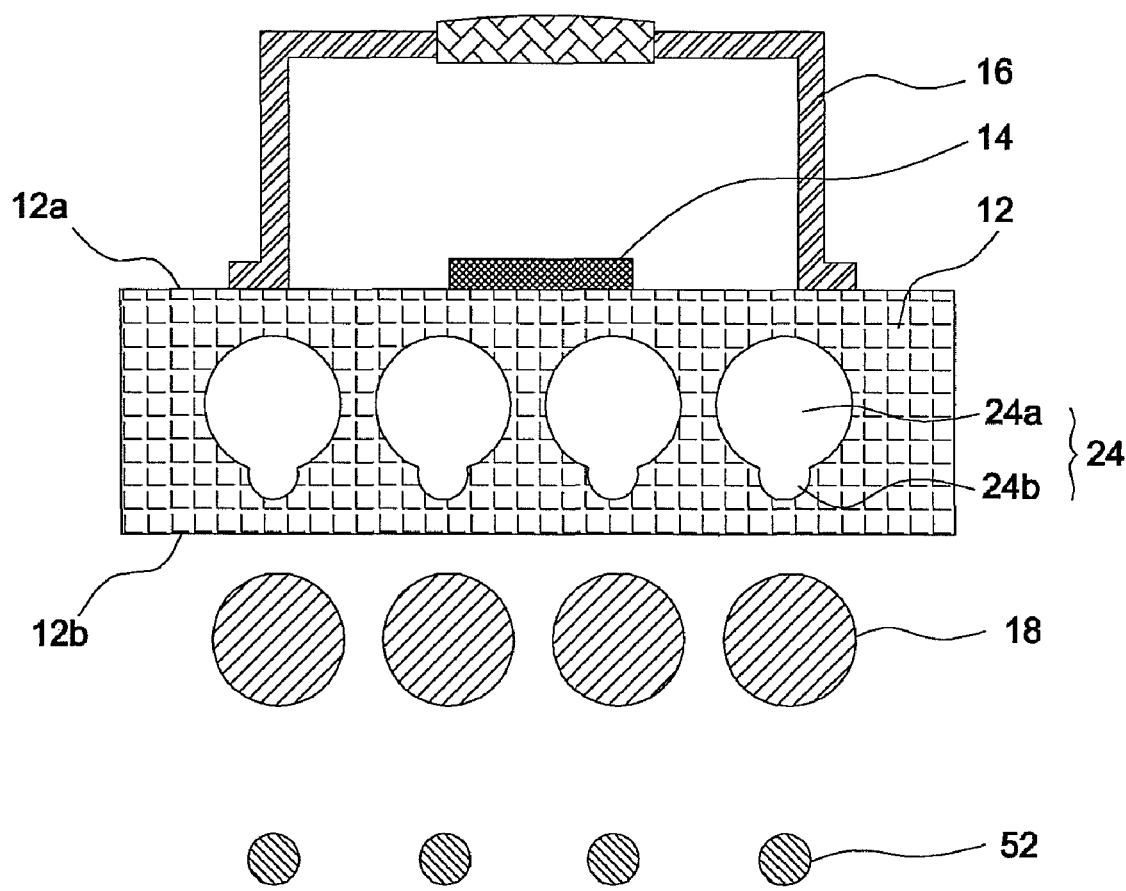
FIG. 7 shows a cross-sectional schematic diagram according to another embodiment of the invention.
Figure 8C:
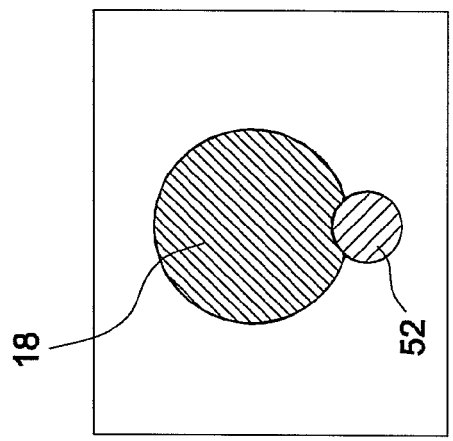
FIGS. 8A to 8C show schematic diagrams illustrating the design principle of the embodiment in FIG. 7.
Figure 8B:
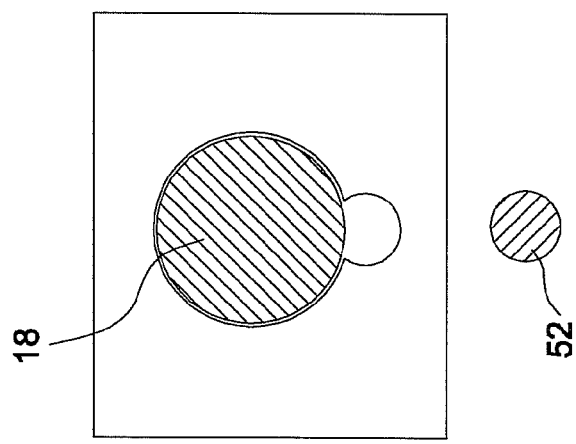
Figure 8A:
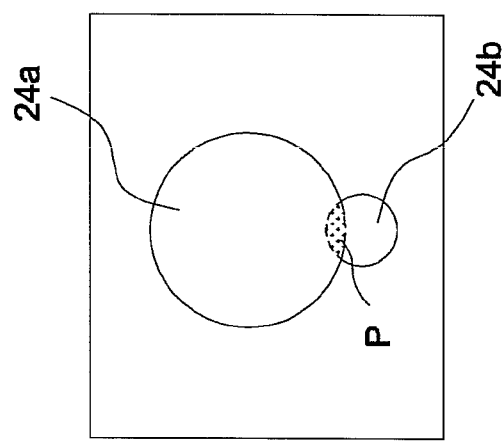

FIG. 7 shows a cross-sectional schematic diagram according to another embodiment of the invention. As shown in FIG. 7, a plurality of separate openings 24 are formed on the base 12 of the laser diode package 50. Each opening 24 penetrates the inside of the base 12 but does not touch the top surface 12a or the bottom surface 12b of the base 12. Each opening 24 includes a main hole 24a and an auxiliary hole 24b next to and in connection with the main hole 24a. During assembly, after the heat pipe 18 is inserted into the corresponding main hole 24a, a pin 52 is then inserted into the auxiliary hole 24b. As shown in FIG. 8A, the main hole 24a and the auxiliary hole 24b form an overlapped portion P, assuming that their outlines are respectively extended to form two complete circles. Thus, after the heat pipe 18 is inserted into the corresponding main hole 24a, the pin 52 that is inserted into an adjacent auxiliary hole 24b is fixed in the base 12 and press against the heat pipe 18 to result in a deformed heat pipe 18 tightly fit in the main hole 24a of the base 12, as shown in FIG. 8C. In other words, in this embodiment, the heat pipe 18 with elastic deformation generated by the press of the pin 52 also provides an interference fit with the main hole 24a of the base 12 to achieve similar effect. In addition, the pins 52 fixed in the base 12 also aid the structural strength of the entire assembly. Certainly, the distributed position of the auxiliary holes 24b are not restricted on the bottom of the main hole 24a, as long as the auxiliary holes 24b are next to the main holes 24a and allow for the insertion of the pins 52 which deforms the heat pipes 18.

Figure 9:
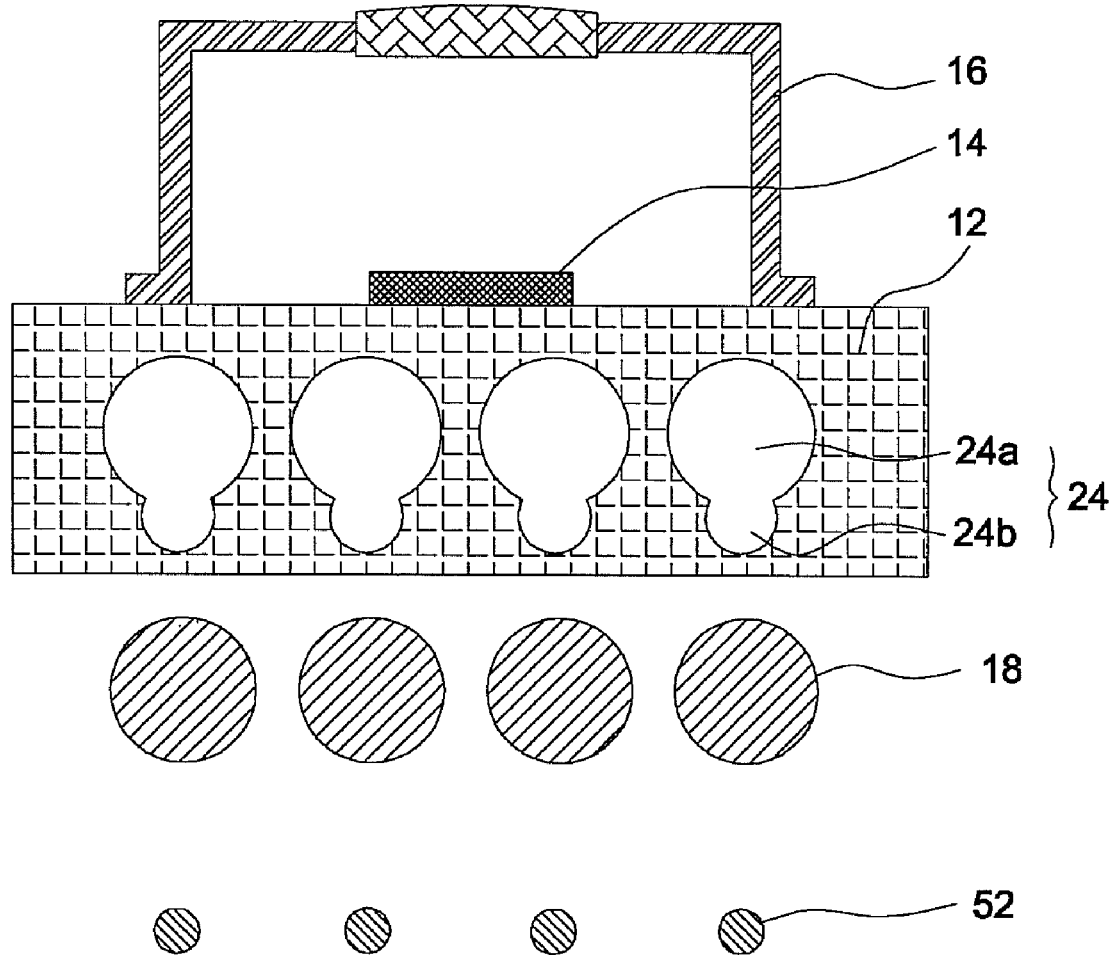
FIG. 9 shows a cross-sectional schematic diagram according to another embodiment of the invention.
Figure 10:
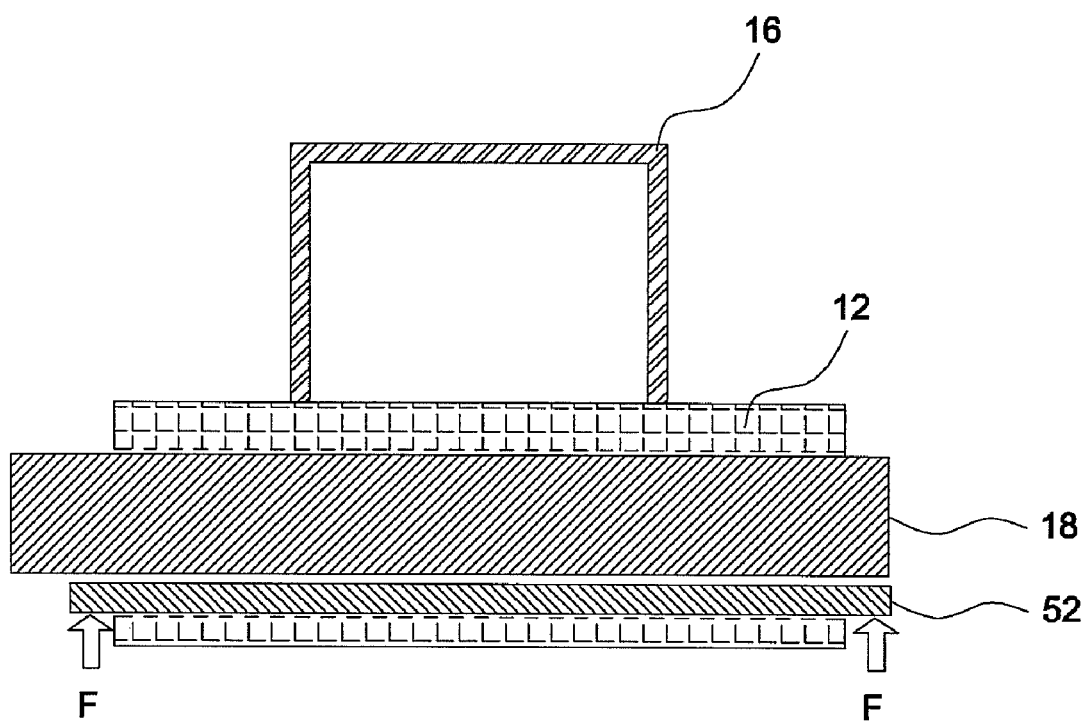
FIG. 10 shows a schematic side view illustrating that heat pipes and pins are placed in the openings of the base.
Figure 11A:
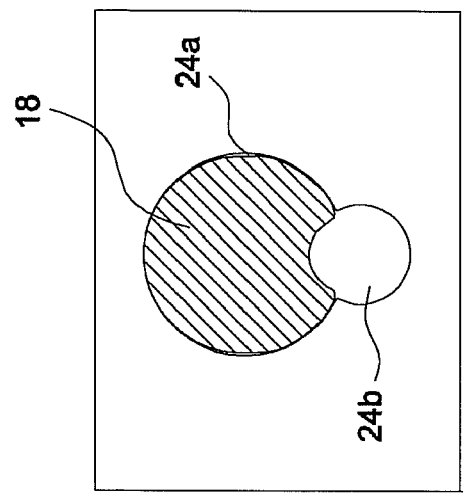
FIGS. 11A to 11C show schematic diagrams illustrating the design principle of the embodiment in FIG. 9.
Figure 11B:
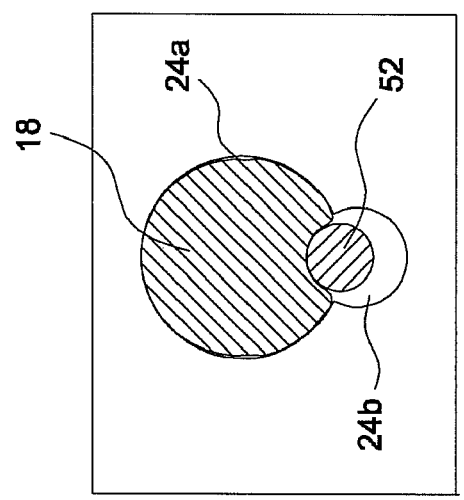
Figure 11C:
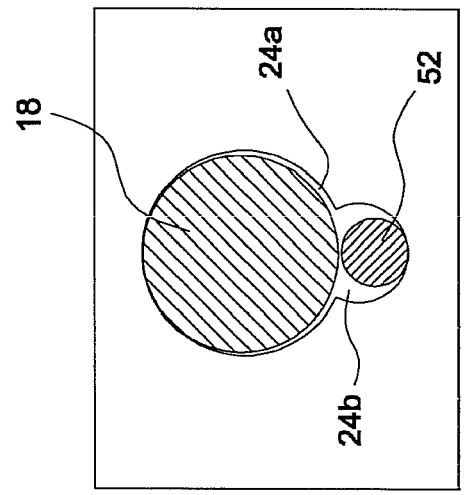
Figure 12:
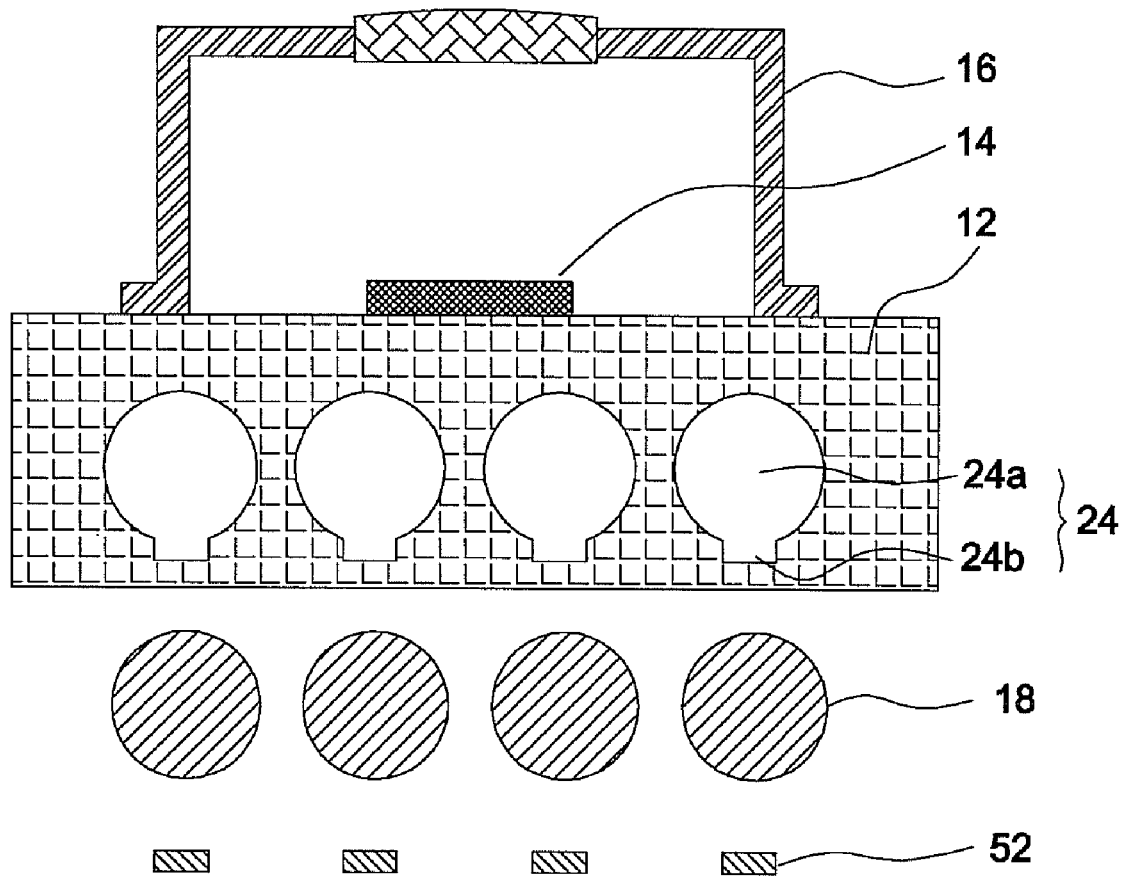
FIG. 12 shows a cross-sectional schematic diagram according to another embodiment of the invention.

FIG. 9 shows a cross-sectional schematic diagram according to another embodiment of the invention. As shown in FIG. 9, a plurality of openings 24 are formed on the base 12 of the laser diode package 60. Each opening 24 penetrates the inside of the base 12 but does not touch the top surface 12a or the bottom surface 12b of the base 12. Each opening 24 includes a main hole 24a and an auxiliary hole 24b next to and in connection with the main hole 24a to receive a heat pipe 18 and a pin 52, respectively. Referring both to FIGS. 9 and 10, the diameter of the main hole 24b is set to be larger than the diameter of the pin 52, so the pin 52 is capable of moving freely during its insertion into the auxiliary hole 24b. Therefore, as the pin 52 is placed in the auxiliary hole 24b, as shown in FIG. 11A, one may apply external force on the pin 52 to allow it to press against and deform the heat pipe 18 to result in a deformed heat pipe 18 tightly fit in the main hole 24a of the base 12, as shown in FIG. 11B. After that, the pin 52 is removed, as shown in FIG. 11C, and the deformed heat pipe 18 and the main hole 24a naturally create an interference fit. According to the embodiment, the distributed position of the auxiliary holes 24b are not restricted on the bottom of the main hole 24a, as long as the auxiliary holes 24b are next to the main holes 24a and allow for the insertion of the pins 52 on which external force is applied. Besides, the cross-section of the pin 52 and the auxiliary hole 24b shown in FIG. 7 and FIG. 9 are exemplified as, but is not limited to, circular-shaped, as long as the effect of pressing the heat pipes 18 to have a tight fit with the main hole 24a can be achieved. Referring to FIG. 12, in one embodiment, the pin 52 and the auxiliary hole 24b are both rectangular-shaped but still allow for a deformed heat pipes 18 tightly fit in the main hole 24a.

Furthermore, the pressing member serving to press against and deform the heat-dissipation element includes, but is not limited to, the pressing plate 22 or the pin 52. Other rigid object that allows for the deformation of the heat pipe 18 is also used.

Figure 13:
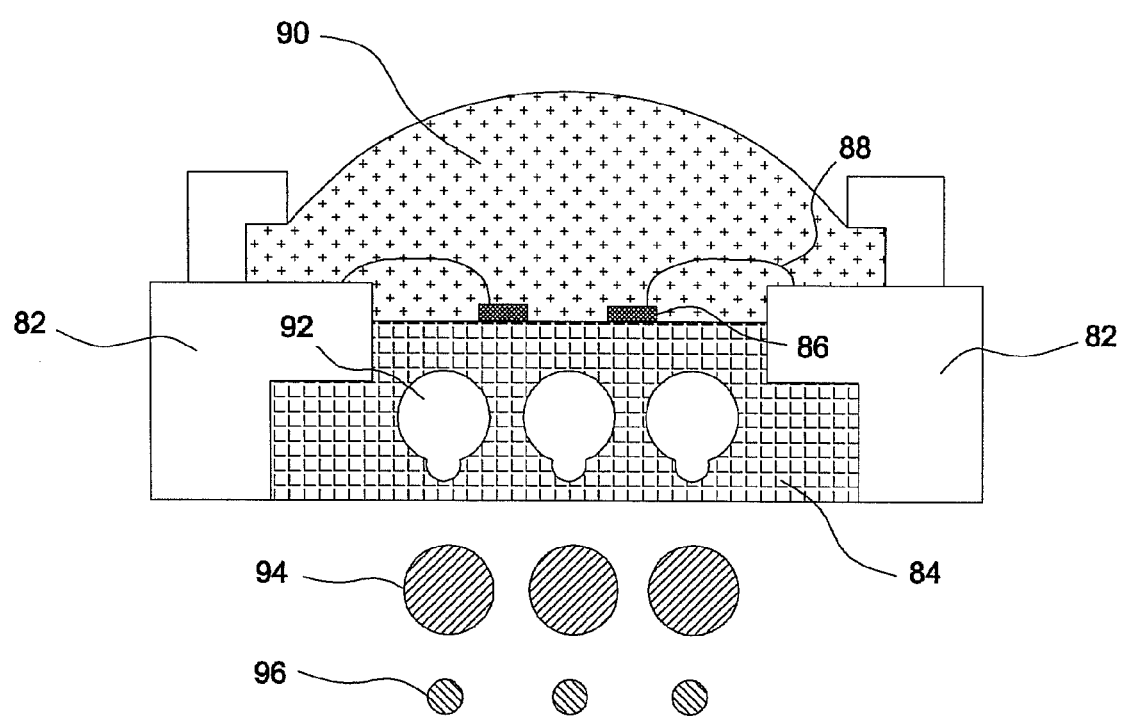
FIG. 13 shows a cross-sectional schematic diagram according to another embodiment of the invention.

Note that the laser diode package illustrated in the above embodiments is merely used to exemplify how to couple a heat-dissipation element to the base of an optoelectronic semiconductor package. It should be understood by those skilled in the art that the above embodiments can be utilized in the heat-dissipation design for any optoelectronic semiconductor package. For example, in a light emitting diode package 80 shown in FIG. 13, a heat conductor 84 is stuffed into a gap in a circuit board 82, and a light emitting diode chip 86 is placed on the heat conductor 84 and electrically connected to the circuit board 82 by lead wires 88. A sealant 90, like epoxy resin or silicone resin, seals the light emitting diode chip 86 on the heat conductor 84. Openings 92 are formed on the heat conductor 84 and the pressing members like pins 96 press against the heat pipes 94 to have the heat pipes 94 tightly fit in the openings 92.

Figure 14:
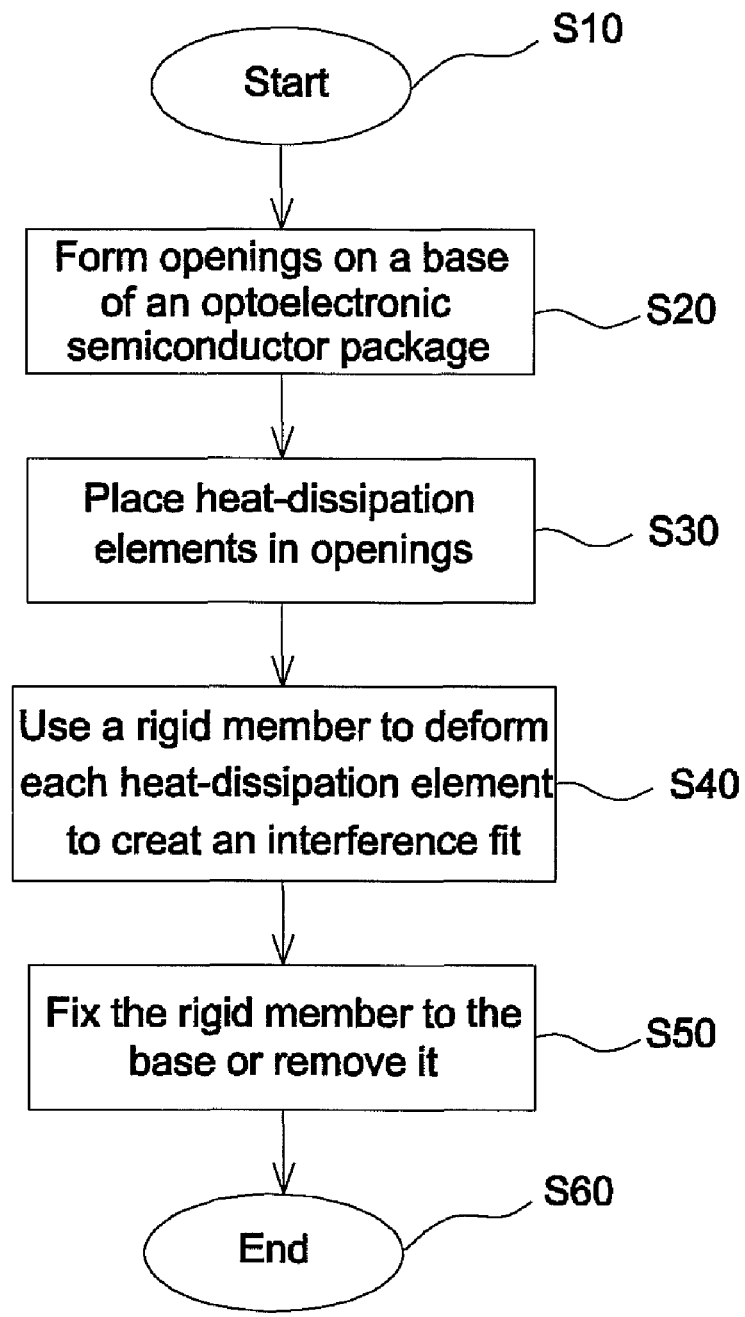
FIG. 14 shows a flow chart illustrating the method for attaching heat-dissipation elements to an optoelectronic semiconductor package according to one embodiment of the invention.

Accompanying with the flow chart shown in FIG. 14, a method for attaching heat-dissipation elements to an optoelectronic semiconductor package according to an embodiment of the invention is described below. Referring to FIG. 14, the method includes the following steps:

Step S10: Start.

Step S20: Form a plurality of openings on a base that carries and touches a heat source capable of emitting light in an optoelectronic semiconductor package. The shape and size of the openings are determined according to the shape and the size of the heat-dissipation elements.

Step S30: Place a plurality of heat-dissipation elements in the openings, with each heat-dissipation element being corresponding to one opening. The heat-dissipation elements is not limited to a specific type. For example, a heat pipe or a heat spreader may be used.

Step S40: Use at least one rigid member to press against and deform each heat-dissipation element to create an interference fit between the heat-dissipation element and its corresponding opening receiving the heat-dissipation element, so each heat-dissipation element is tightly attached to the base of the optoelectronic semiconductor package.

Step S50: Fix the rigid member to the base or remove the rigid member from the base.

Step S60: end.

In one embodiment, the rigid member may be a pressing plate to press against and deform each heat-dissipation element, and the rigid member is attached on the base by screwing, riveting, or engagement. In an alternate embodiment, the rigid member may be a pin. After the pin is inserted in the opening to press against and deform the heat-dissipation element, the pin may be fixed in or removed from the opening of the base.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An optoelectronic semiconductor package for packaging a heat source capable of emitting light, comprising:
    a base for carrying and touching the heat source, wherein the base comprises a first side surface in contact with the heat source, a second side surface opposite the first side surface, and a plurality of openings provided on the second side surface;
    a seal member for sealing the heat source on the base;
    a plurality of heat-dissipation elements, each of the heat-dissipation elements being inserted in one of the corresponding openings and the heat-dissipation element placed in the corresponding opening being deformed to result in a tight coupling between the heat-dissipation element and the base; and
    a pressing plate attached to and in contact with the second side surface, wherein the pressing plate presses against and deforms each of the heat-dissipation elements placed in the corresponding opening.

2. The optoelectronic semiconductor package according to claim 1, wherein the pressing plate is attached to the second side surface by screwing, riveting or engagement.

3. The optoelectronic semiconductor package according to claim 1, wherein the pressing plates are provided with a plurality of cavities formed on its one side that touches the base.

4. An optoelectronic semiconductor package for packaging a heat source capable of emitting light, comprising:
    a base for carrying and touching the heat source, wherein the base comprises a first side surface in contact with the heat source, a second side surface opposite to the first side surface, and a plurality of openings penetrating the inside of the base and not in contact with the first side surface and the second side surface;
    a seal member for sealing the heat source on the base: and
    a plurality of heat-dissipation elements, each of the heat-dissipation elements being inserted in one of the corresponding openings and the heat-dissipation element placed in the corresponding opening being deformed to result in a tight coupling between the heat-dissipation element and the base.

5. The optoelectronic semiconductor package according to claim 4, wherein each of the openings comprises a main hole for receiving the heat-dissipation element and an auxiliary hole next to and in connection with the main hole.

6. The optoelectronic semiconductor package according to claim 5, further comprising a plurality of pins, with each of the pins being corresponding to one heat-dissipation element, wherein each of the pins is inserted into one of the corresponding auxiliary holes to press against and deform the heat-dissipation element received in the main hole.

7. A method for attaching heat-dissipation elements to an optoelectronic semiconductor package, comprising the steps of:
    forming a plurality of openings on a base that carries and touches a heat source capable of emitting light;
    placing a plurality of heat-dissipation elements in the openings; with each of the heat dissipation elements being corresponding to one opening; and
    using at least one rigid member to press against and deform the heat-dissipation elements to create an interference fit between each heat-dissipation element and its corresponding opening that receives the heat-dissipation element.

8. The method for attaching heat-dissipation elements according to claim 7, further comprising the step of
    fixing the rigid member to the base.

9. The method for attaching heat-dissipation elements according to claim 8, wherein the rigid member is fixed to the base by screwing, riveting, engagement or insertion.

* * * * *